(12) United States Patent
Nevirkovets et al.

(10) Patent No.: US 12,239,028 B2
(45) Date of Patent: *Feb. 25, 2025

(54) MEMORY CELLS BASED ON SUPERCONDUCTING AND MAGNETIC MATERIALS AND METHODS OF THEIR CONTROL IN ARRAYS

(71) Applicant: SeeQC Inc., Elmsford, NY (US)

(72) Inventors: Ivan Nevirkovets, Evanston, IL (US); Oleg Mukhanov, Putnam Valley, NY (US)

(73) Assignee: SeeQC, Inc., Elmsford, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 18/492,511

(22) Filed: Oct. 23, 2023

(65) Prior Publication Data
US 2024/0057484 A1 Feb. 15, 2024

Related U.S. Application Data

(63) Continuation of application No. 17/307,931, filed on May 4, 2021, now Pat. No. 11,800,814.

(60) Provisional application No. 63/021,056, filed on May 6, 2020.

(51) Int. Cl.
| | | |
|---|---|---|
| G11C 16/04 | (2006.01) |
| G11C 11/44 | (2006.01) |
| H10N 60/12 | (2023.01) |
| H10N 60/80 | (2023.01) |
| H10N 60/84 | (2023.01) |
| H10N 69/00 | (2023.01) |

(52) U.S. Cl.
CPC ............ *H10N 60/84* (2023.02); *G11C 11/44* (2013.01); *H10N 60/12* (2023.02); *H10N 60/805* (2023.02); *H10N 69/00* (2023.02)

(58) Field of Classification Search
CPC ...................................................... G11C 11/44
See application file for complete search history.

(56) References Cited

U.S. PATENT DOCUMENTS 5,323,344 A * 6/1994 Katayama ............ H10N 69/00
365/210.11
9,384,827 B1 * 7/2016 Reohr ................ G11C 11/1655
(Continued)

*Primary Examiner* — Pho M Luu
(74) *Attorney, Agent, or Firm* — Hoffberg & Associates; Steven M. Hoffberg

(57) ABSTRACT

A memory cell having a Josephson junction and a magnetic junction in close proximity. The two junctions may be vertically integrated. The magnetic junction has at least two magnetic layers with different coercive forces and a non-magnetic layer therebetween, to form a spin valve or pseudo-spin valve. A magnetization direction of a magnetic layer with lower coercive force can be rotated with respect to the larger coercive force magnetic layer(s). Magnetic fields produced by appropriately configured control lines carrying electric current, or spin-polarized current through the magnetic junction, can result in rotation. The magnetic junction influences the Josephson critical current of the Josephson junction, leading to distinct values of critical current which can serve as digital logic states. The memory cell can be integrated into large arrays containing a plurality of the cells, to enable the selective READ and WRITE operations.

27 Claims, 9 Drawing Sheets

(56) References Cited

U.S. PATENT DOCUMENTS

| | | | |
|---|---|---|---|
| 11,800,814 B1* | 10/2023 | Nevirkovets | G11C 11/1673 |
| 2020/0176662 A1* | 6/2020 | Dayton | H10N 50/85 |

* cited by examiner

MEMORY CELLS BASED ON SUPERCONDUCTING AND MAGNETIC MATERIALS AND METHODS OF THEIR CONTROL IN ARRAYS

CROSS REFERENCE TO RELATED APPLICATIONS

The present application is a continuation of U.S. patent application Ser. No. 17/307,931, filed May 4, 2021, now U.S. Pat. No. 11,800,814, issued Oct. 24, 2023, which is a non-provisional of, and claims benefit of priority under 35 U.S.C. § 119(e) from U.S. Provisional Patent Application No. 63/021,056, filed May 6, 2020, the entirety of which is expressly incorporated herein by reference.

BACKGROUND OF THE INVENTION

Field of the Invention

This invention relates to hybrid devices involving magnetic and superconducting materials, and particularly, to devices used as memory cells and methods of their control in arrays for high-density memory in an integrated circuit based on Josephson junctions or other superconducting devices that operate at cryogenic temperatures.

Description of the Related Prior Art

Each patent, published application and other reference cited herein is expressly incorporated herein by reference in its entirety.

Superconducting electronic circuits comprise Josephson junctions as the basic constituent elements. In particular, integrated circuits intended for operation in high-performance low-power superconductor-based computers use damped Josephson junctions to produce very fast low-voltage pulses when the junctions switch from the superconductive to the resistive state and back again. These circuits, also known as Single-Flux Quantum (SFQ) circuits, operate at very high speed and consume very low power. The voltage pulses, with pulsewidth of order 1 ps and height of order 1 mV, have integrated pulsewidth corresponding to one flux quantum $\Phi_0=h/2e=2.07$ mV×ps, and are known as SFQ pulses. See, for example, U.S. Pat. Nos. 9,520,180; 9,887,000; 10,460,796.

A Josephson junction (JJ) comprises two superconducting (S) layers with a thin insulating (I) or normal-metallic (N) layer between them (SIS or SNS). For example, this may be Nb/Al/AlO$_x$/Nb, where the Al is sufficiently thin to be induced into the superconducting state, for circuits that are designed to operate at ~5° K or below. It is known in the art that a magnetic field applied in the plane of the JJ will modulate the critical current $I_c$ according to a sinc function dependence: $(|sin(x)/x|)$, where $x=\pi\Phi/\Phi_0$ and $\Phi$ is the magnetic flux inside the junction.

A Josephson junction is a two-terminal device, which when biased above its critical current $I_c$, can generate a time-series of SFQ pulses. The $I_c$ of a given JJ is effectively a constant. Although $I_c$ varies with temperature, thermal switching of $I_c$ is generally not useful for fast electronics. In comparison, a switchable magnetic Josephson junction (MJJ) has an $I_c$ that may be tuned over a range of values. Because the barrier of an MJJ contains a ferromagnetic material, which being a permanent magnet material has hysteresis, the stable magnetic flux in the junction may have (at least) two different values. These correspond to two different values of the critical current, $I_c$, and one may repeatedly switch between them. The non-volatile aspect, namely that magnetization stays on after the stimulation has ceased, makes this switchable MJJ useful as a memory element. The term "ferromagnetic material" is being used in this disclosure in its broadest sense, namely, meaning that a state of magnetization of the material remains even after any external stimulus has been terminated, and the magnetization has a hysteretic behavior. By way of example, without intent of limiting, ferromagnetic materials include Fe, Co, Ni, some rare earth elements, and alloys of all of these between themselves and with non-magnetic materials (such as Al, Nb, Cu, Ag, Pd, etc.).

Operation of superconducting computers requires not only SFQ-based logic circuits, but also requires Random Access Memory (RAM) architectures compatible with these high-performance parameters. The central component of any RAM is a memory cell. Many designs of memory cells for use with SFQ circuits are known in the prior art. Some cells, based on Josephson junctions, store one flux quantum and are called single flux-quantum (SFQ) memory cells. These memory cells, although they dissipate low energy during operation, are built using several JJs and contain a superconducting loop, which requires a large area on a chip, and therefore, such cells are not suitable for high-density memory arrays. Typical examples of SFQ memory cells are disclosed in publication by Kurosawa et al., "Single flux-quantum Josephson memory cell using a new threshold characteristic", Appl. Phys. Lett., vol. 43, pp. 1067-1069 (1983), and in WO 2013/180946 A1 "Josephson magnetic memory system".

Non-SFQ cryogenic memory cells are also known in the prior art. In order to realize a high storage density, memory cells involving magnetic memory elements in combination with superconducting elements have been proposed. U.S. Pat. No. 5,039,656 "Superconductor magnetic memory using magnetic films", provides a memory cell which comprises two magnetic films having different coercive forces, or different uniaxial anisotropies, and a superconducting element either sandwiched between the two magnetic films, or placed outside of the magnetic films in the close proximity to them. The superconducting element has a plurality of Josephson junctions in the area completely covered by magnetic films. The magnetic films serve to store the binary information by acquiring one of two states with opposite magnetization orientations in the two magnetic films, whereas the multiple Josephson junctions serve for reading the state stored in the magnetic films. This readout may be accomplished by either entering the resistive state under influence of the combined action of the stray magnetic field induced by the magnetic films, if both films have the same magnetization direction, or remaining superconductive for opposite magnetization directions of the two magnetic films. Such a memory cell is hard to fabricate in a controllable way in order to have laterally positioned multiple Josephson junctions with reproducible characteristics. Also, such a cell containing multiple Josephson junctions is hard to scale down in size. It is also noted that in this memory cell, only a stray magnetic field component induced from the magnetic films parallel to the films is used, which is rather weak as compared to the fringe field, and therefore, the memory cell operates inefficiently.

The memory cell disclosed in U.S. Pat. No. 5,276,639 "Superconductor magnetic memory cell and method for accessing the same" is similar to that in U.S. Pat. No. 5,039,656 mentioned above, however, only one Josephson junction of sandwich-type geometry is used as a sensor of the state of the magnetic element. Again, similarly to U.S. Pat. No. 5,039,656, the memory cell disclosed in U.S. Pat. No. 5,276,639 operates using the stray magnetic field, induced by the magnetic element in the Josephson junction, whose magnetic lines of force are parallel to the planes of the superconducting films comprising the Josephson junction. It is shown experimentally in the publication "Multi-terminal Superconducting-Ferromagnetic Device with Magnetically Tunable Supercurrent for Memory Application", IEEE Trans. Appl. Supercond., vol. 28, article 1800904 (2018) that such a parallel magnetic field causes a relatively small shift of the Josephson critical current vs. magnetic field ($I_c(H)$) dependence along the H axis, but does not influence the maximum magnitude of $I_c$. This is not efficient use of the magnetic field produced by the magnetic element.

In U.S. Pat. No. 5,276,639, a method to access a memory cell is proposed, which requires magnetization reversal of both "soft" and "hard" magnetic layers involved in the cell. This is hard to realize practically, because one of the magnetic layers must have a considerably larger corcive force than the other, but both layers need to be "soft" enough to minimize the field needed for the magnetization reversal. Also, methods to access the cells in the arrays proposed in U.S. Pat. No. 5,276,639 require complicated sequences of control signals during the READ operation, which is hard to realize in practice. The method of memory cell control disclosed in U.S. Pat. No. 5,039,656 suffers from similar drawbacks.

The switching device disclosed in U.S. Pat. No. 5,930,165 has a magnetic element that, in one of its two magnetic states, induces a fringe field in order to depress the superconductivity in an adjacent superconductive stripe to convert at least a portion of the superconductive pathway to the normal state. Formation of the normal region is undesirable because of excessive energy dissipation due to Joule heating.

The magnetic JJ disclosed in the publication Baek et al., "Hybrid superconducting-magnetic memory device using competing order parameters", Nature Commun., vol. 5, article 3888 (2014), has low Josephson critical current density and low critical voltage because the magnetic materials are constituent parts of the barrier region of the junction. This limits usage of the junctions of this class in some applications, including some memory designs.

A hybrid superconducting-magnetic junction disclosed by Vernik et al., "Magnetic Josephson Junctions With Superconducting Interlayer for Cryogenic Memory", IEEE Trans. Appl. Supercond., vol. 23, article 1701208 (2013) has an SIS'FS structure, where S' is a thin superconducting layer, I is an insulator, and F is a dilute magnetic layer which is induced into a weakly superconducting state due to the proximity effect with the superconducting S and S' electrodes. Switching the magnetization direction of a single F layer leads to a symmetric shift (for two directions of the magnetization) of the Fraunhofer-like pattern of the Josephson SIS' junction. This design requires a bias magnetic field in order to discriminate between the two logic states, and the discrimination will deteriorate upon reducing the junction size.

A memory cell disclosed by Held et al., "Superconducting memory based on ferromagnetism", Appl. Phys. Lett., vol. 89, article 163509 (2006) has a magnetic element that controls the Josephson current in a JJ sensor. However, this design cannot be scaled down to very small sizes. Similarly, a memory cell disclosed in the US 2009/0244958 includes a magnetoresistive element and at least one superconducting element wired in parallel with the magnetoresistive element, which does not allow for compact memory cell design.

The embodiments of the prior art for hybrid superconducting magnetic memory cells based on JJs are varied, but all such embodiments focus on coupling magnetic flux from the magnetic element into the plane of the Josephson junction. When a non-zero magnetic flux is coupled to the JJ, the critical current $I_c$ is suppressed. However, magnetic elements tend to generate values of magnetic field B, not flux (D. For this reason, all devices of this type cannot easily be scaled to small dimensions; the flux will be too small to produce a large relative suppression of $I_c$.

Each reference cited herein is expressly incorporated herein by reference in its entirety. See:

Anishchanka, Alexandra. Proximity Effects in Superconductor Ferromagnet Structures. Diss. Bochum University, Germany 2008.

Aprili, Marco. "Nano-Structures Hybrides Supraconducteur-Ferromagnetique." Ecole Franco-Roumaine: Magnetisme des systemes nanoscopiques et structures hybrids, Brasov, 2003.

Baek et al., "Hybrid superconducting-magnetic memory device using competing order parameters", Nature Commun., vol. 5, article 3888 (2014)

Beutner, Sven. Probing Quantum States of Josephson Junctions with Ferromagnetic Barriers by Microwaves. Diss. diploma thesis, TUM, 2006.

Bhatia, E., et al, "External field tunable superconducting transition temperature in Nb/Co/Py/Nb superconductor/exchange spring/superconductor films" ArXiv preprint 1903.03022 (2019).

Birge, N., et al., "Ferromagnetic Josephson Junctions for Cryogenic Memory," Proc. SPIE vol. 10732 (2018).

Blum, Yuval. Coherence Effects in SNS and SNFNS Structures. Diss. Tel Aviv University, 2003.

Bolginov, V. V., et al., "Reentrant temperature dependence of critical current in superconductor—ferromagnet—superconductor junctions based on PdFe alloys", arXiv: 07092495v1, (2007).

Buzdin, A. I., and M. Yu Kupriyanov. "Josephson junction with a ferromagnetic layer." JETP Lett 53.6 (1991): 321.

Buzdin, Alexander. "Superconductor-Ferromagnet Nanostructures." NanoSpain Conf. (2009).

Caruso, R., et al., "Properties of Ferromagnetic Josephson Junctions for Memory Applications," IEEE Trans. Appl. Supercond., vol. 28, art. 1800606 (2018).

Caruso, R., et al., "RF-assisted switching in magnetic Josephson junctions," Appl. Phys. Lett., vol. 123, art. 133901 (2018).

Dayton, I. M., et al., Experimental Demonstration of a Josephson Magnetic Memory Cell With a Programmable π-Junction, IEEE Magnetics Letters, vol. 9, art. 3301905, (2018).

Devizorova, Zh., S. V. Mironov, A. S. Mel'nikov, and A. Buzdin, "Electromagnetic proximity effect controlled by spin-triplet correlations in superconducting spin-valve structures", Phys. Rev. B 99, 104519 (2019).

Eschrig, Matthias. "Spin-polarized supercurrents for spintronics." Phys. Today 64.1 (2011): 43.

Feofanov, A. K., et al., "Implementation of superconductor/ferromagnet/superconductor π-shifters in superconducting digital and quantum circuits", Nature Physics, vol. 6, p. 593-597 (2010).

Frolov, Sergey Maksimovich. Current-phase relations of Josephson junctions with ferromagnetic barriers. Diss. University of Illinois at Urbana-Champaign, 2005.

Gildert, Suzanne. Macroscopic quantum tunnelling effects in Josephson junctions. Diss. University of Birmingham, School of Physics and Astronomy, 2008.

Golubov, A. A. and M. Yu. Kupriyanov, "Effect of single Abrikosov vortices on the properties of Josephson junctions", Sov. Phys. JETP, vol. 65, 849 (1987).

Golubov, A. A. and M. Yu. Kupriyanov, "Theoretical Investigation of Josephson Tunnel Junctions with Spatially Inhomogeneous Superconducting Electrodes", J. Low Temp. Phys., vol. 70, 83 (1988).

Held, R., et al., "Superconducting memory based on ferromagnetism", Appl. Phys. Lett. 89, 163509, (2006).

Hoffman, Silas Eli. "Spin Torques in Magnetic and Superconducting Tunnel Junctions." Thesis, UCLA (2012).

Huertas Hernando, Daniel. Coherent Transport in Superconducting and Ferromagnetic Hybrid Systems. TU Delft, Delft University of Technology, 2002.

Hyun, O. B., J. R. Clem, and D. K. Finnemore, "Motion of a single superconducting vortex", Phys. Rev. B, vol. 40, 175 (1989).

Kandelaki, Ervand. "Transport in Josephson Heterostructures and Numerical Applications of Bosonization for Fermionic Systems." Thesis, Bochum Univ., Germany (2014).

Katam, N., et al., "Superconducting-magnetic field programmable gate array," IEEE Trans. Appl. Supercond., vol. 28 art. 1300212 (2018).

Khaire, Trupti S., et al. "Observation of spin-triplet superconductivity in Co-based Josephson junctions." Physical review letters 104.13 (2010): 137002.

Khaydukov, Yu, et al. "Structural, magnetic and superconducting characterization of the CuNi/Nb bilayers of the S/F type using PNR and complementary techniques." Circa 2010.

Kirichenko, A. F., et al., "Pipelined DC-Powered SFQ RAM", IEEE Trans. Appl. Supercond., vol. 11, No. 1, p. 537-540, (2001).

Kitamura, Michihide. Shapiro Steps in BSCCO Intrinsic Josephson Junctions. INTECH Open Access Publisher, 2012.

Klenov, N., et al., "Periodic Co/Nb pseudo-spin-valve for cryogenic memory", Beilstein J. Nanotechnol. Vol. 10, pp, 833-839 (2019).

Klose, C., et al. "Correlation between spin-flop transition and enhanced spin polarized supercurrents in ferromagnetic Josephson junctions." Accomplishments and Opportunities 1500 (2012): 28.

Kupriyanov, M. Yu, et al. "Extraordinary magnetic field behavior of SIFS Josephson junctions with an inhomogeneous transparency of the FS interface", Pis'ma v ZhETF vol. 88., iss 1, pp. 50-53 (2008).

Kurosawa et al., "Single flux-quantum Josephson memory cell using a new threshold characteristic", Appl. Phys. Lett., vol. 43, pp. 1067-1069 (1983)

Madden, A., et al., "Phase-controllable Josephson junctions for cryogenic memory", Supercond. Sci. Technol. Vol. 32, art. 015001(2019).

Mai, Sebastian. "Charge transport in irradiated graphene and Josephson structures." (2013).

Mancusi, D., et al. "Evaluation of the specific boundary resistance of superconducting/weakly ferromagnetic hybrids by critical temperature measurements." Journal of Applied Physics 110.11 (2011): 113904.

Miao, Guoxing. "Spintronics Driven by Superconducting Proximity Effect." In Superconductors: New Developments, ed by A. Gabovich. (2015).

Miller, S. L., K. R. Biaga, J. R. Clem, and D. K. Finnemore, "Critical currents of cross-type superconducting-normal-superconducting junctions in perpendicular magnetic fields", Phys. Rev. B, vol. 31, 2684 (1985).

Mironov, S., A. S. Mel'nikov, and A. Buzdin "Electromagnetic proximity effect in planar superconductor-ferromagnet structures", Appl. Phys. Lett. 113, 022601 (2018).

Mukhanov, O., "Energy efficient SFQ technology", IEEE Trans. Appl. Supercond., vol. 21, pp. 760-769, (2011).

Nevirkovets et al., "Multiterminal Superconducting-Ferromagnetic Device with Magnetically Tunable Supercurrent for Memory Application", IEEE Trans. Appl. Supercond., vol. 28, article 1800904 (2018)

Nevirkovets, I. P., "A superconducting transistor-like device having good input-output isolation" Appl. Phys. Lett. 95, 052505, (2009).

Nevirkovets, I. P., et al., "Multi-Terminal Superconducting Nonequilibrium Device With a Ferromagnetic Screen" IEEE Trans. Appl. Supercond., vol. 21, No. 3, p. 721-723, (2011).

Niezielski, B., et al., "Spin-valve Josephson junctions for cryogenic memory," Phys. Rev. B97, art. 024517 (2018).

Ohnishi, K., et al, "Nonlocal injection of spin current into a superconducting Nb wire", Appl. Phys. Lett. 96, 192509, (2010).

Peng, L., et al. "Ultrafast optical probes of dynamic behavior in $La_{0.7}Sr_{0.3}MnO_3/YBa_2Cu_3O_7$-$\Sigma$/$La_{0.7}Sr_{0.3}MnO_3$ heterostructure." Pis'ma v ZhETF vol. 99, iss. 1, pp. 30-34 (2014).

Polonsky, S. V., et al., "Rapid Single Flux Quantum Random Access Memory", IEEE Trans. Appl. Supercond., vol. 5, p. 3000 (1995).

Pomorski, Krzysztof, and Przemyslaw Prokopow. "Towards the Determination of Properties of the Unconventional Josephson Junction Made by Putting Non-Superconducting Strip on the Top of Superconducting Strip." Electronic Journal of Theoretical Physics 7.23 (2010): 85-121.

Prepelitsa, A., et al. "Nonuniform superconducting state in superconductor/ferromagnet nanoscale layered system." Moldavian Journal of the Physical Sciences 5 (2006): N1.

Prischepa, S. L., C. Cirillo, C. Bell, V. N. Kushnir, J. Aarts, C. Attanasio, and M. Yu Kupriyanov. "Resistive transitions in $Nb/Cu_{0.41}Ni_{0.59}$/Nb trilayers", Pis'ma v ZhETF vol. 88, iss. 6, pp. 431-435 (1988).

Radovic, Z., I. Petkovic, and N. Chtchelkatchev. "Resonant tunneling in short Josephson junctions," XVI National Symposium on Condensed Matter Physics, Sokobanja (2004).

Ryazanov, V. V. "In: Series on NanoScience and Technology. vol. "Fundamentals of Superconducting Nanoelectronics", Chapter 8. Springer. pp. 219-248 (2011). "Physics and applications of superconducting phase inverters based on superconductor-ferromagnet-superconductor Josephson junctions."

Samokhvalov, A. V., S. N. Vdovichev, B. A. Gribkov, S. A. Gusev, A. Yu. Klimov, Yu. N. Nozdrin, V. V. Rogov, A. A. Fraerman, S. V. Egorov, V. V. Bol'ginov, A. B. Shkarin, and V. S. Stolyarov, "Properties of Josephson Junctions in the Nonuniform Field of Ferromagnetic Particles", JETP Letters, vol. 95, pp. 104-113 (2012).

Singh, Amritpal. Multi-layer magnetism and thermal stability in perpendicular magnetic tunnel junctions. Diss. The University of Alabama Tuscaloosa, 2014.

Sprungmann, D., et al. "Evidence for triplet superconductivity in Josephson junctions with barriers of the ferromagnetic Heusler alloy $Cu_2MnAl$." Physical Review B 82.6 (2010): 060505.

Stolle, Renke. Makroskopisches Quantenverhalten von Josephson Kontakten aus Hochtemperatur-Supraleitern. Diss. diploma thesis, TUM, 2006.

Susanto, H. "Josephson Junctions with Phase Shifts, Stability Analysis of Fractal Fluxons." Thesis, University of Twenty (2006).

Tagirov L. R., et al, "Theory of Superconductor-Strong Ferromagnet Contacts." Magnetic Resonance in Solids. Electronic Journal 6 (2004): 200.

Tolpygo, S., et al., "Planarized Fabrication Process With Two Layers of SIS Josephson Junctions and Integration of SIS and SFS π-Junctions", IEEE Trans. Appl. Supercond. vol. 28, art. 1101208 (2019).

Vedyayev, A. V., N. V. Ryzhanova, and N. G. Pugach. "The Influence of sd Scattering on the Josephson Current in SFS Sandwiches," Proceedings of the $3^{rd}$ Moscow Symposium on Magnetism (2005).

Vernik et al., "Magnetic Josephson Junctions With Superconducting Interlayer for Cryogenic Memory", IEEE Trans. Appl. Supercond., vol. 23, article 1701208 (2013)

Weides, M., et al. "0-π Josephson tunnel junctions with ferromagnetic barrier." Physical review letters 97.24 (2006): 247001.

Weides, M., K. Tillmann, and H. Kohlstedt. "Fabrication of high quality ferromagnetic Josephson junctions." Physica C: Superconductivity and its applications 437 (2006): 349-352.

Wild, Georg Hermann. Josephson Junctions with Ferromagnetic Interlayer. Diss. Universitat Munchen, 2012.

Yuh, P. F., et al., "One-junction superconducting memory cell with column sense", IEEE Trans. Appl. Supercond., vol. 5, p. 3459 (1995).

See: U.S. Patent and Published Application Nos. U.S. Pat. Nos. 4,023,290; 4,601,015; 5,039,656; 5,276,639; 5,365,476; 5,930,165; 5,942,765; 6,226,160; 6,229,154; 6,233,171; 6,414,870; 6,538,297; 6,605,822; 6,670,630; 6,769,170; 6,812,039; 6,818,549; 7,054,120; 7,159,303; 7,292,417; 7,332,738; 7,443,719; 7,533,068; 7,535,069; 7,624,088; 7,969,805; 8,008,942; 8,200,304; 8,208,288; 8,270,209; 8,283,943; 8,406,834; 8,456,903; 8,686,751; 8,971,977; 9,013,916; 9,069,928; 9,208,861; 9,281,057; 9,286,962; 9,443,576; 9,520,181; 9,627,045; 9,747,968; 9,972,380; 2003/0173498; 2003/0173997; 2006/0225165; 2007/0174227; 2007/0194225; 2009/0167342; 2009/0244958; 2011/0267878; 2011/0298489; 2012/0120719; 2012/0184445; 2012/0302446; 2013/0007087; 2014/0229705; 2015/0032994; 2015/0332164; 2018/0025775; 2019/0188596; 2019/0207076; 2019/0296743; 2019/0392878; 20200028512; and 20200075093.

A recent publication that disclosed promising results was I. Nevirkovets and O. Mukhanov, "Memory Cell for High-Density Arrays Based on a Multiterminal Superconducting-Ferromagnetic Device," Physical Review Applied, vol. 10, art. 034013 (2018). This fabricated and demonstrated a memory cell comprising a magnetic junction on top of a JJ, where a small portion of the JJ was exposed to a fringe field from the magnetic junction. Depending on the state of the magnetic junction, the critical current of the Josephson junction underwent a small change of as much as 10%. While a much larger effect of 20% or more would be desired for practical applications, this report did not disclose how a larger effect could be achieved.

A larger effect of about 40% $I_c$ change was achieved in another publication by Nevirkovets and Mukhanov, ISEC 2017, $16^{th}$ International Superconductive Electronics Conference (ISEC): Sorrento (Napoli), Italy, Jun. 12-16, 2017, TU-SDM-06. However this result was obtained on imperfect devices in which the SIS junction displayed non-ideal I-V curve and Fraunhofer-like pattern, and therefore, was non-reproducible on devices fabricated using state-of-the-art techniques.

What is needed is a system for hybrid superconducting and magnetic memory cells, with high access speed, small size, high integration density, low power consumption, and efficient operation, improving substantially on the prior art devices. The disclosed memory cell is intended satisfy the above requirements and to operate in the memory arrays in digital superconducting circuits.

SUMMARY OF THE INVENTION

The disclosed memory cell comprises a superconductive Josephson junction and a magnetic junction situated in a close proximity to the Josephson junction, the two junctions being vertically integrated in the preferred embodiment. The Josephson junction comprises two superposed superconductive layers with a non-superconductive layer therebetween. The magnetic junction comprises at least two magnetic layers with different coercive forces and a non-magnetic layer therebetween to form a spin valve or pseudo-spin valve, wherein the magnetization direction of at least one magnetic layer with a lower coercive force can be rotated with respect to the magnetization direction of the magnetic layer(s) having larger coercive force. The rotation can be accomplished either by magnetic fields produced by appropriately configured control lines carrying electric current, or by spin-polarized current through the magnetic junction. The magnetic junction influences the magnitude of the Josephson critical current of the adjacent Josephson junction by producing magnetic fields of different strength and direction when the magnetization orientations of the magnetic layers in the said magnetic junction are different as a result of the controlled magnetization rotation in the magnetic layer with the lower coercive force, respectively leading to the two distinct values of the Josephson critical current which can serve as logic '0' and '1' states. The so obtained memory cell can be integrated into the large arrays containing a plurality of the cells, the arrays configured to enable the selective READ and WRITE operations.

The memory cell proposed in the present invention overcomes the above deficiencies suffered by the prior memory cell proposals. It is an object of this invention to provide a superconductor-ferromagnetic memory cell that has a high access speed, a small size, a high integration density, and a low power consumption. Furthermore, methods of WRITE and READ operations of the memory cells in arrays (referred together as "control") are also provided by the present invention.

These and other objects of this invention are achieved in the memory cell by including a magnetic element and a superconducting element vertically integrated in close proximity to each other, as shown in FIGS. 1-3. Furthermore, the magnetic element has at least two magnetic layers, wherein the magnetization vector of one magnetic layer can be rotated using a lower external magnetic field or a lower Spin-Transfer Torque (STT) than the respective physical values for the second magnetic layer. The superconducting element comprises a JJ, with at least one edge of the magnetic element lying inside of the area occupied by the JJ. This edge of the magnetic element comprises a source of magnetic field that emanates from the magnetic element (the fringe field), and can in certain circumstances partially or fully depress superconductivity in a portion of the superconducting element(s), and, in addition, couple magnetic flux into the JJ. The magnetic flux in the JJ may be oriented with field components parallel and/or perpendicular to one or both superconducting electrodes and the ultrathin barrier layer between the two electrodes.

Spin injection works by carrying spin-polarized electrons from one magnetic material through a spacer (for example, a tunnel barrier) to another. In some cases spin injection may provide faster switching with a smaller current than inductive coupling.

The preferred magnetic materials for cryogenic applications are easily switched with a small control current at the temperature of operation. Materials optimized for room temperature are likely to have a value of the coercive field $H_c$, namely a sufficient applied magnetic field for switching the magnetic state of the junction, that becomes impractically large at cryogenic temperatures ~4-10° K. Conversely, a ferromagnetic material that is magnetically soft, i.e., it has low $H_c$ at 4° K, may not even be a ferromagnet at room temperature. For example, an alloy of Pd with ~1% Fe has a Curie temperature only about 20-30° K, but this may be chosen in some embodiments for a 4-10° K device, since its value of $H_c$ is in the range of a few Oe, maybe about 1 Oe (~100 A/m in SI units).

When the magnetization vectors of the two magnetic layers are oriented anti-parallel, the fringe field couples mostly from one magnetic layer to the other, so that little or no magnetic flux couples into the JJ (see FIG. 3C). Thus, the magnitude of the critical current $I_c$ in the JJ is unaffected, representing storage of a logical '0'.

In contrast, for the parallel orientation of the two magnetization vectors, the fringe field penetrates at least a portion of at least one of the electrodes of the JJ, as shown in FIGS. 3A and 3B. This causes the magnitude of the maximum critical current $I_c$ of the Josephson junction to be significantly reduced, as shown in FIG. 5A. This reduction in $I_c$ is non-volatile and can be read out non-destructively, and comprises storing the logical '1'. Further, in some embodiments corresponding to FIG. 3B, a portion of the magnetic flux is coupled into the barrier between the two superconducting electrodes of the JJ, which may cause the maximum critical current $I_c$ to be shifted horizontally along the magnetic field axis if the dependence of the Josephson critical current vs. externally applied magnetic field is measured, as shown in FIG. 5B. The horizontal shift associated with coupling parallel flux of order $\Phi_0/2$ into the barrier has been recognized in the prior art, but the vertical suppression associated with flux penetration into the superconducting electrode is not taught in the prior art. This vertical suppression may preferably be associated with vortex penetration into the superconducting electrode, and should scale for very small magnetic junctions and small Josephson junctions.

A preferred embodiment also includes a write line, comprising a superconducting line configured to inductively couple magnetic flux into at least one of the magnetic layers, but not into the JJ, as shown in FIGS. 1A-1C. Referring to FIG. 1A, this inductive magnetic flux will be of a magnitude that can reverse the magnetization of one of the two magnetic films of the cell, thus switching a parallel orientation to an anti-parallel orientation, or vice versa. In another aspect of the preferred embodiment of the memory cell, schematically shown in FIG. 1B, the control lines are configured in such a way that the currents fed through them can switch the magnetization orientation of the soft magnetic layer in mutually perpendicular directions. In yet another aspect of the preferred embodiment of the memory cell, schematically shown in FIG. 1C, the control lines are configured in such a way that the magnetic fields produced by the currents fed through the control lines can switch the magnetization orientation of the soft magnetic layer between the easy magnetization directions enabled due to shape anisotropy. Alternatively, the write operation may comprise an injection current (i.e., through the magnetic junction) that may be at least partially spin-polarized, inducing a spin torque on at least one of the magnetic films, and reversing the magnetization of a magnetic film in this fashion.

In a further aspect of the invention, the depression of the critical current of the JJ in the '1' state is at least 15% of that in the '0' state for reliable discrimination between the two states, so that arrays of cells can be designed with large margins for READ and WRITE operations. According to the present invention, this can be achieved in several ways as follows. First, the suppression of $I_c$ at zero external magnetic field, H, strongly depends on the position of the magnetic element on the area of the JJ. It is known that a magnetic vortex penetrating one electrode in the center of a disc-shaped JJ can reduce $I_c(H=0)$ to zero. Therefore, in one of the preferred embodiments schematically shown in FIG. 1D, the magnetic junction is position in such a way that one of its edges is close to the center of JJ, thereby enabling desirable $I_c$ suppression in the '1' logic state due to the fringe field induced from the said edge. In another preferred embodiment suggested in FIG. 4, which shows the top view of a memory cell, the JJ is exposed to significant fringe fields in the '1' state on all sides of the MJ, providing efficient coupling of these fringe fields. Furthermore, the majority of the area of the JJ (e.g., more than 50%) comprises superconducting films that are subject to magnetic penetration by these fringe fields, which enables a large effect of 20% $I_c$ depression or more. Magnetic junctions can be made quite small, and the magnetic films in the junctions may comprise single magnetic domains. Manufacturing arrays of memory cells with small MJs on top of somewhat larger JJs is feasible.

In some aspects of the present invention, these stacked magnetic Josephson memory cells may be integrated together on the same chip with superconducting write and read lines to form different types of arrays, in order to achieve a high-density large-scale memory fully compatible with superconducting logic.

It is therefore an object of the present invention to provide a superconducting memory cell, comprising: a magnetic junction comprising a first magnetic layer indirectly magnetically coupled to a second magnetic layer, the first magnetic layer being separated from the second layer, and having a respective different coercivity and a distinctly controlled magnetization vector with respect to the second magnetic layer; and a Josephson junction comprising a superconducting layer closely magnetically coupled to the magnetic junction and having an electrical property which varies by at least 15% over a range of the state of the net magnetization state of the magnetic junction. The electrical property may vary by at least 20% over the range of the state of the net magnetization state of the magnetic junction. In some cases, depending on noise and precision of measurement, and acceptable error rate, a lower threshold may be applied, for example, 10%, 7.5%, 5%, 4%, or 2.5%. However, 15-20% difference would typically be a good compromise to achieve an acceptable error rate.

It is also an object of the present invention to provide a method of retrieving information from a superconducting memory cell, comprising: a magnetic junction comprising a first magnetic layer indirectly magnetically coupled to a second magnetic layer, the first magnetic layer being separated from the second layer, and having a respective different coercivity and a distinctly controlled magnetization vector with respect to the second magnetic layer, and a Josephson junction comprising a superconducting layer closely magnetically coupled to the magnetic junction and having an electrical property which varies by at least 15% over a range of the state of the net magnetization state of the magnetic junction; and sensing the magnetization state of the magnetic junction using the critical current of the Josephson junction.

It is a further object of the present invention to provide a memory cell based on superconducting and magnetic materials comprising: a magnetic junction comprising at least two magnetic layers, with respectively different coercive forces and distinct magnetization vectors, and a non-magnetic layer situated between the two magnetic layers; a Josephson junction having two superconducting layers and a non-superconducting layer situated between the two superconducting layers, having a critical current, at least one of the two superconducting layers extending over the magnetic junction in close proximity to a surface of the magnetic junction, wherein the magnetic junction and the Josephson junction are magnetically coupled wherein the critical current of the Josephson junction varies in response to a joint magnetization vector of the at least two magnetic layers of the magnetic junction.

The magnetic junction and the Josephson junction may be closely magnetically coupled, and the critical current of the Josephson junction may vary by at least 15% in response to a joint magnetization vector of the magnetic layers of the magnetic junction over a range of the distinct magnetization vectors of each of the two magnetic layers.

The magnetic junction may be in galvanic contact with the Josephson junction, or the magnetic junction may not have galvanic contact with the Josephson junction.

The magnetic and Josephson junctions may be vertically integrated.

The magnetic junction may have a smaller area than the Josephson junction.

At least one edge of the magnetic junction may be situated over an area of the Josephson junction. One edge of the magnetic junction may be situated over the area of the Josephson junction close to its lateral geometric center.

The magnetic junction may have an electrically insulating barrier between the two magnetic layers. The magnetic junction may have a nonmagnetic metal barrier between the two magnetic layers.

A mutual orientation of magnetization vectors of the two magnetic layers may have two reversible states, a parallel state and an antiparallel state. A mutual orientation of magnetization vectors of the two magnetic layers may have two reversible states, a perpendicular state and a non-perpendicular state.

The Josephson junction may have a critical current selectively dependent on a mutual orientation of magnetization vectors of the two magnetic layers. The critical current may change dependent on a change of the mutual orientation of magnetization vectors of the two magnetic layers. The memory cell may further comprise an output port configured to read out a state of the magnetic junction by measurement of a critical current of the Josephson junction.

The memory cell may further comprise an input of the magnetic junction, configured to pass a spin-polarized current through the magnetic junction, to control a mutual magnetization orientation of the two magnetic layers.

The memory cell may further comprise an electrical control configured to control a magnetic field imposed on the two magnetic layers, and to change a mutual orientation of magnetization vectors of the two magnetic layers.

The electrical control may be further configured to control the mutual orientation of magnetization vectors of the two magnetic layers to assume a plurality of discrete states. The Josephson junction may be selectively responsive to each of the plurality of discrete states to produce a distinguishable response when the Josephson junction has an imposed bias. The plurality of discrete states may be, e.g., two states, three states, four states, or an arbitrary number of states. In general, a binary storage paradigm provides the maximum separation between states, but lower storage density than a paradigm which seeks to exploit existence of intermediate states, which may have higher error rates or involve more complex read and write logic.

The memory cell is configured in such a way that the Josephson junction has a critical current which varies by at least 20% responsive to the net magnetization vector of the magnetic junction. Likewise, the minimum critical current variation may be 25%, 30%, 35%, 40%, 45%, 50%, 60%, 75%, or even 100% (i.e., the critical current is fully suppressed).

The Josephson junction may comprise two superconducting layers and a non-superconducting layer situated between the two superconducting layers, at least one of the two superconducting layers extending over the magnetic junction, to thereby closely magnetically couple the magnetic junction and the Josephson junction.

A still further object of the present invention provides a memory array comprising a plurality of memory cells arranged in a regular manner, each memory cell comprising: a magnetic junction comprising two magnetic layers, with respectively different coercive forces and distinctly-controlled magnetization vectors, and a non-magnetic layer situated between the two magnetic layers; a Josephson junction having at least one superconducting layer extending over the magnetic junction in close proximity to a surface of the magnetic junction, the Josephson junction being configured to have a critical current which varies by at least 15% responsive to a net magnetization vector of the magnetic junction; and at least two input ports, configured to address respective memory cells of the regular array of the plurality of memory cells.

Each respective memory cell may be separately addressable by selection operations on each of the at least two input ports.

The plurality of memory cells may be arranged in a rectangular array having rows and columns, and the at least two input ports comprise a row select input and a column select input.

The memory array may be controlled by an automated control configured to generate selection signals for the at least two input ports. The automated control may be further configured to determine a state of the Josephson junction while generating the selection signals for the at least two independent inputs. The automated control may be configured to perform READ and WRITE operations of respective memory cells using superconducting input and output lines.

The distinctly controlled magnetization vectors of the magnetic layers may be switchable between a parallel orientation and an anti-parallel orientation using control lines carrying an electric current or a spin-polarized current through the magnetic junction, wherein the parallel orientation results in net magnetization vector increase and the antiparallel orientation results in net magnetization vector decrease. The distinctly controlled magnetization vectors of the magnetic layers may be switchable between a parallel orientation and a perpendicular orientation using control lines carrying an electric current or a spin-polarized current through the magnetic junction, wherein the parallel orientation results in net magnetization vector disposed along a parallel axis and the perpendicular orientation results in net magnetization vector deviating from the parallel axis. The distinctly controlled magnetization vectors of the magnetic layers may be switchable between a parallel orientation, an antiparallel orientation, a left perpendicular orientation, and a right perpendicular orientation, using control lines carrying an electric current or a spin-polarized current through the magnetic junction, wherein the Josephson junction is selectively responsive to at least four different net magnetization vectors.

Each memory cell may comprise a first magnetic layer and a second magnetic layer, the first and second magnetic layers having independently controlled net magnetization vectors, the Josephson junction being selectively responsive to each of the net magnetization vectors of the first magnetic layer and the second magnetic layer, to provide at least two states responsive to a net magnetization vectors of the first magnetic layer and the second magnetic layer.

The Josephson junction may be proportionally responsive to a magnitude of a net magnetization vector to provide at least two states responsive to the net magnetization vector magnitude.

The Josephson junction may be proportionally responsive to an angle of a net magnetization vector to provide at least two states responsive to the net magnetization vector angle.

The magnetization vectors of the magnetic layers comprising the magnetic junction may be switchable between at least a parallel state, an anti-parallel state, and a mutually perpendicular state using respective control lines carrying an electric current or a spin-polarized current through the magnetic junction.

The regular array may have rows and columns, and a specific memory cell of the plurality of memory cells may be addressable by a diagonal selection operation.

The regular array may have rows and columns, and a specific memory cell of the plurality of memory cells may be addressable by a combination of a row selection, a column selection and a diagonal selection of the at least two input ports.

Each input may comprise a superconductive line.

The control for the memory array may be implemented in traditional logic (with appropriate interface and buffering), or as discussed in U.S. Patent Application Nos. 20200106444, or 20200090738, for example. In general, the controller for the memory array includes circuitry (which may be superconducting logic) that translates a request into a memory array address, address the storage elements storing the desired data, or where the desired data is to be stored, after an appropriate time to read or write the data (by injecting an electrical current or spin current), which may be a single clock cycle, read the data into the control over the output lines. In some cases, it is appropriate to verify a logic write, and as such, the read operation may be part of both read and write operations. In some cases, the write operation takes more than one clock cycle to obtain a reliable rotation of the magnetic field, and in the case of non-binary rotation, the duration of application of the current may determine an amount of rotation of the magnetic field vector. The time may conveniently be measured in clock cycles. A field programmable logic array (FPLA) operating at room temperature may provide and process control signals for the memory array.

BRIEF DESCRIPTION OF THE DRAWINGS

In FIG. 1D, the control lines are not shown for the sake of clarity.

DESCRIPTION OF THE PREFERRED EMBODIMENTS

Figure 1A:
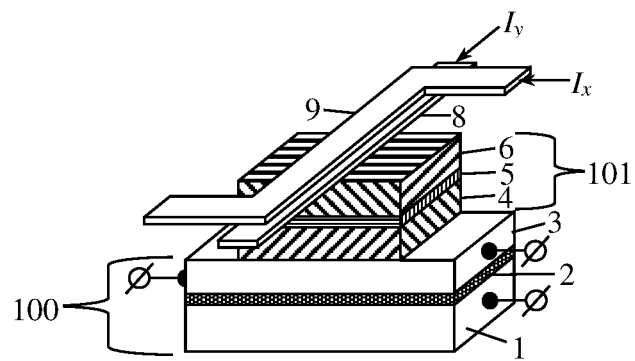
FIGS. 1A, 1B, 1C and 1D show a perspective view of a preferred embodiments of the hybrid superconductive-magnetic memory cell in accordance with the present invention.

Referring to FIGS. 1A-1D, there are shown perspective views of three embodiments of the hybrid superconductive-magnetic memory cell in accordance with the present invention. The memory cell is composed of a Josephson junction 100 formed with two segments 1 and 3 of superconductive layers and a barrier 2 between the superconductive layers, and a magnetic junction 101 formed with two segments 4 and 6 of ferromagnetic layers and a barrier 5 between the ferromagnetic segments. Further, the Josephson junction and the magnetic junction are situated in close proximity to each other and form a vertically integrated structure, wherein at least one edge of the Josephson junction protrudes beyond the edge of the magnetic junction. The proposed memory cell is a multi-terminal device wherein each superconducting layer and each magnetic layer, separately, may have at least one contact to feed electric current and to read-out voltage. In FIGS. 1-2, only the contacts to superconducting layers are schematically shown for the sake of clarity of the drawings.

Figure 1B:
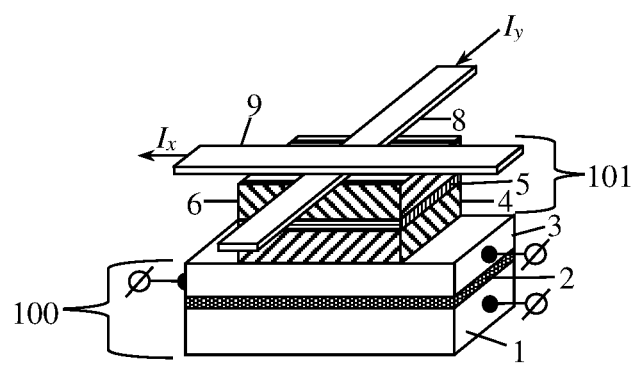
Figure 1C:
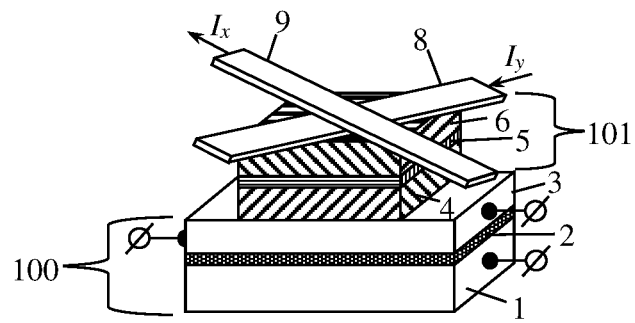
Figure 1D:
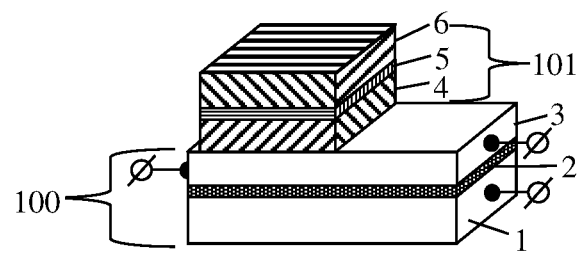
Figure 2A:
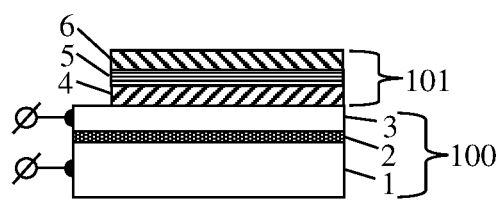
FIGS. 2A, 2B, 2C, 2D, 2E, and 2F show cross-sections of other preferred embodiments of the memory cell.
Figure 2B:
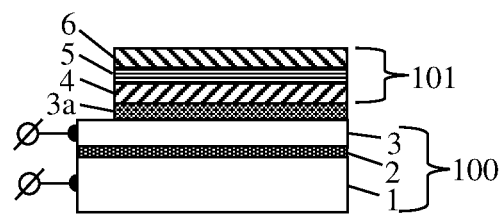
Figure 2C:
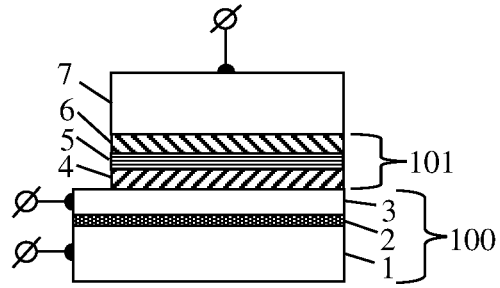
Figure 2D:
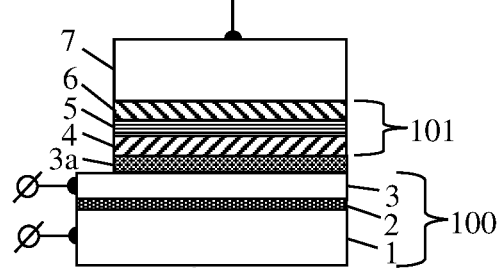
Figure 2E:
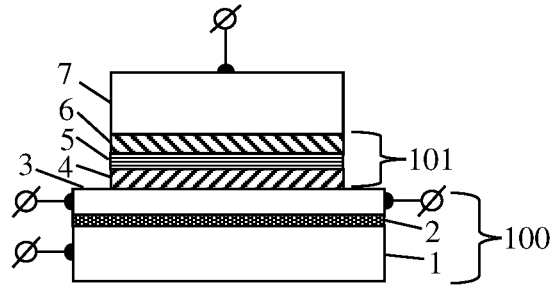
Figure 2F:
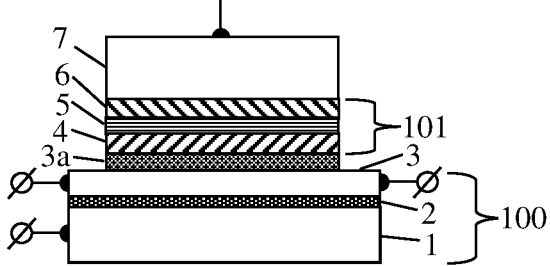

In a particular embodiments shown in FIGS. 1A-1C, two opposite edges of the Josephson junction 100 protrude beyond the edges of the magnetic junction 101 in a symmetric way. Possible embodiments of the proposed cell are not limited to the symmetric configuration, but can also be asymmetric, as shown in FIG. 1D. Such asymmetric configuration may be advantageous for obtaining definite suppression at least 20% of the critical current, $I_c$, in the Josephson junction for '1' logical state, as was mentioned above. The lateral shape of the magnetic and Josephson junctions can be not only rectangular, but can also have other forms, for example, circular or elliptic. An elliptic or diamond-like form of the magnetic junction 101 allows one to beneficially exploit the shape anisotropy in the magnetization switching process. The magnetic junction 101 can be a true spin valve or a pseudospin valve. In the first case, an antiferromagnetic layer (not shown) is used to fix the magnetization vector in one of the magnetic layers 4 and 6.

In the second case, there is no antiferromagnetic layer, but the magnetic layers 4 and 6 have different coercive fields, so that their magnetization vectors can be switched at different values of the magnetic field. The magnetization vectors of the magnetic layers can be oriented either parallel or perpendicular to the planes of the films comprising the cell structure. The barrier material 5 can be either an insulating or a conductive material that provides indirect exchange coupling between the magnetic layers 4 and 6.

An example of such indirect exchange coupling is the Ruderman-Kittel-Kasuya-Yosida (RKKY) interaction in the case of a metallic layer 5 (see P. Bruno, Phys. Rev. B 52, 411 (1995), and references therein), or, in a magnetic tunnel junction (MTJ), an exchange coupling between the ferromagnetic electrodes due to a torque generated by spin currents flowing through the tunnel junction (see J. C. Slonczewski, Phys. Rev. B 39, 6995 (1989)). The barrier 5 can be made from a combination of these insulating and conductive materials.

Furthermore, two superconducting wires 8 and 9, which are electric control lines, are situated in close proximity to the magnetic junction 101, electrically insulated from each other and from the magnetic junction 101. These wires, by feeding currents $I_x$ and $I_y$, serve to provide an external magnetic field needed to change the magnetization vector direction of the soft magnetic layer (being one of the layers 4 and 6) or both magnetic layers 4 and 6. Electrical contacts are established on the exposed edges of the superconducting layer 3 and the superconducting layer 1, and another electrical contact may be established to the superconducting layer 7 (not shown in FIGS. 1A-1D) adjacent to the external magnetic layer 6 of the magnetic junction. The superconducting layer 7 may not be present in some preferred embodiments, as depicted in FIGS. 1A-1D and in the cross-sectional views in FIGS. 2A and 2B, but may be present in other preferred embodiments as shown in the cross-sectional views in FIGS. 2C, 2D, 2E, and 2F.

The operational principle of the memory cell in accordance with the present invention is explained by reference to FIGS. 3A, 3B, 3C, 5A, and 5B. The memory cell function is based on the fact that the maximum Josephson current of the Josephson junction 100 can be controlled by a magnetic junction 101 in such a way that switching the magnetization direction in one of the magnetic layers 4, 6 by 180° ($\pi/2$ radians) or 90° ($\pi/4$ radians) with respect to the fixed magnetization direction in the second of the magnetic layers 4, 6 results in two distinct values of the maximum Josephson current in the Josephson junction 100. These two Josephson current states represent the binary "0" and "1" logic states for a memory cell.

Figure 3A:
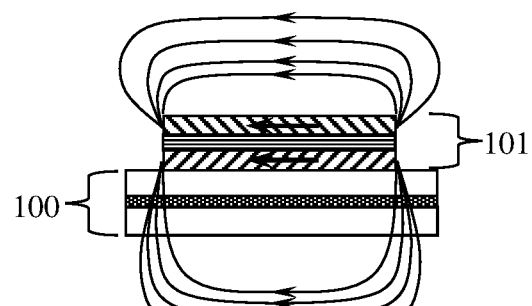
FIGS. 3A, 3B, and 3C show plots of magnetic field distribution in the memory cell for different magnetization orientations in the magnetic layers, and for different thicknesses of the bottom superconducting electrode.
Figure 3B:
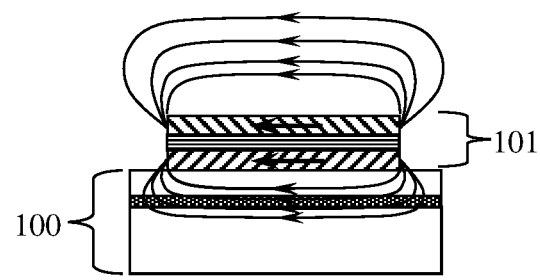
Figure 3C:
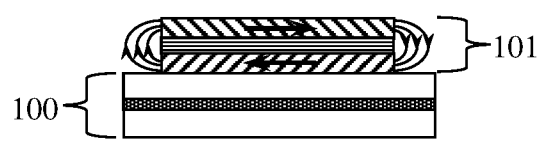
Figure 5A:
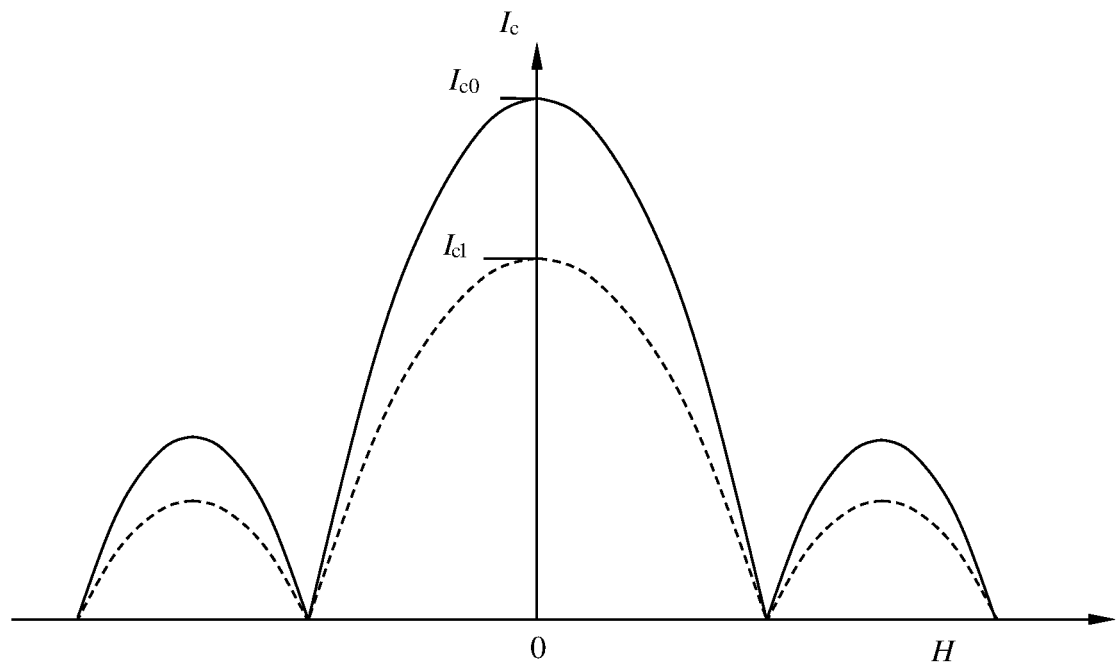
FIGS. 5A and 5B show plots of the Josephson critical current vs. applied magnetic field dependence of the Josephson junction for different magnetization orientations in the magnetic layers of an adjacent magnetic junction, and for different thicknesses of the bottom superconducting electrode of the Josephson junction.
Figure 5B:
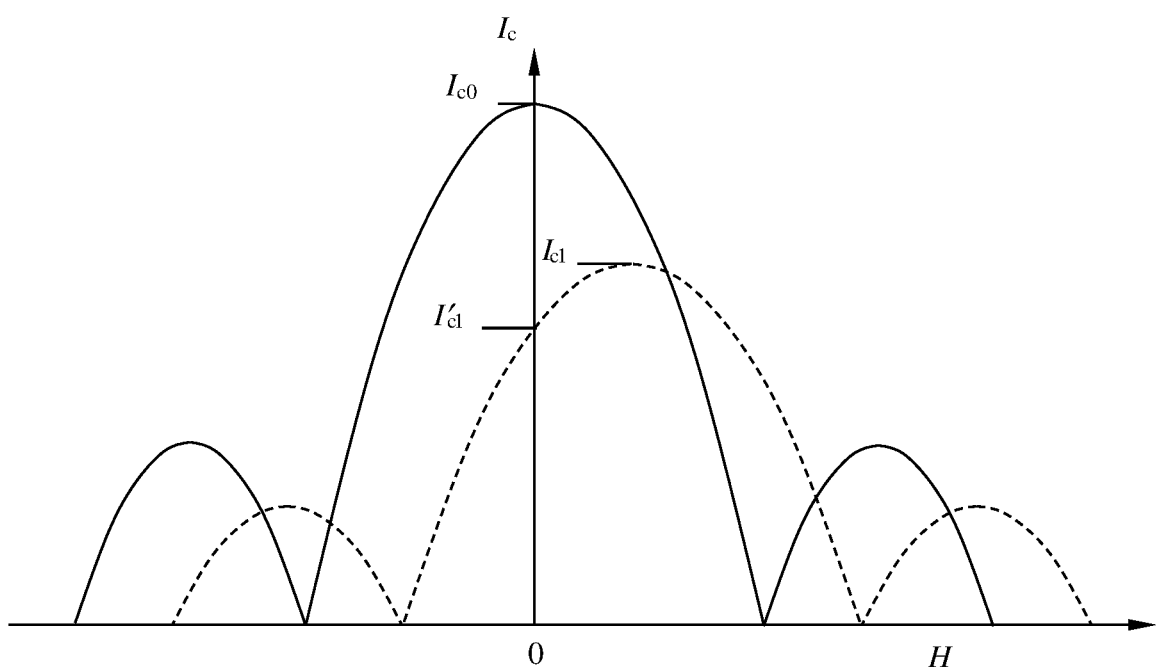

FIGS. 3A and 3B show the magnetic field distribution generated by the magnetic junction 101 in the case of parallel mutual orientation of the magnetization vectors in the magnetic layers 4 and 6, whereas FIG. 3C shows the magnetic field distribution generated by the magnetic junction 101 in the case of anti-parallel mutual orientation of the magnetization vectors in the magnetic layers 4 and 6. In the anti-parallel magnetization vectors orientation (shown in FIG. 3C), the magnetic lines of force of the two magnetic layers 4 and 6 are configured into a closed circulating pattern in such a way that the magnetic flux is completely enclosed within the magnetic junction 101 and no magnetic flux penetrates the Josephson junction 100. In this case, the Josephson junction 100 has maximum Josephson current value $I_{c0}$ as depicted in FIG. 5A. On the other hand, in the parallel mutual magnetization vectors orientation (shown in FIGS. 3A and 3B), there is a strong component of the magnetic field perpendicular to the superconducting layers comprising the Josephson junction 100, which leads to a partial suppression of the Josephson current in the Josephson junction to the value of $I_{c1}$ (see FIG. 5A).

In the case of FIG. 3A, the perpendicular component partially suppresses the superconductivity in both superconducting layers 1 and 3 composing the Josephson junction 100 (see FIGS. 1A, 1B, 1C, 1D, 2A, 2B, 2C, 2D, 2E, and 2F). Physically, this takes place in the junctions where the thicknesses of the superconducting electrodes 1 and 3, $d_{S1}$ and $d_{S3}$, respectively, are smaller or comparable to the respective London penetration depths, $\lambda_{S1}$ and $\lambda_{S3}$ (typically, $\lambda$=80–90 nm for niobium thin films at 4.2 K). The partial suppression of the superconductivity in the superconducting electrodes leads to a reduction of the maximum Josephson current in the Josephson junction 100 from the level $I_{c0}$ characteristic of the anti-parallel orientation to the level $I_{c1}$, as is illustrated in FIG. 5A, where the dependences of the Josephson critical current vs. externally applied magnetic field, $I_c(H)$, are shown by solid and dashed curves for the respective anti-parallel and parallel magnetization vectors orientations in the magnetic layers 4 and 6. The two maximum Josephson current levels $I_{c0}$ and $I_{c1}$, characteristic of the anti-parallel and parallel magnetization orientations, respectively, of the magnetic layers 4 and 6, serve as logical "0" and "1" states according to the preferred embodiment of the present invention. A single cell has a scale of order 200 nm.

Referring to FIG. 3B, if only the superconducting layer 3 has the thickness $d_{S3} \leq \lambda_{S3}$, whereas $d_{S1} > \lambda_{S1}$, then, for the state with the parallel mutual magnetization vectors orientation in the magnetic layers 4 and 6, the magnetic field from the magnetic junction 101 penetrates only the superconducting layer 3 of the Josephson junction 100, and there is a magnetic field component inside of the Josephson junction 100 which is parallel to the planes of the superconducting layers 1 and 3. As a result of such magnetic field penetration into the Josephson junction 100, its maximum Josephson current value is not only partially suppressed, but also the entire dependence of the Josephson critical current vs. externally applied magnetic field, $I_c(H)$, is shifted along the H axis, as is illustrated by the dashed curve in FIG. 5B. In this case, the logical states "0" and "1" are determined by the maximum Josephson currents $I_{c0}$ and $I'_{c1}$ (see FIG. 5B).

Referring to FIGS. 1A-1C, the necessary switching of the mutual magnetization between the parallel and anti-parallel orientations can be performed by supplying appropriate electrical currents to the wires 8 and 9. The two wires 8 and 9 enable half-selection of a specific memory cell within the memory array. Half-selection corresponds to an applied magnetic field that is approximately half of the value required to switch the magnetic film, so that two half-selection currents can switch the film. Furthermore, the two wires 8 and 9 may be configured in such a way (not shown) as to allow not only for parallel and anti-parallel mutual magnetization vectors orientation in the magnetic layers 4 and 6, but also for rotation of the magnetization vector of the soft magnetic layer by 90 degrees with respect to the magnetization vector of the hard magnetic layer. Such 90 degree orientation of the magnetization vectors in the layers 4 and 6 will also result in two distinct maximum Josephson current levels (for zero applied external magnetic field H) in the Josephson junction 100.

In a preferred embodiment, the Josephson junction may comprise superconducting thin films of niobium, with a critical temperature of 9.2 K. The barrier of the Josephson junction may comprise a thin layer of insulating aluminum oxide of order 1 nm thick. Alternatively, other superconducting materials can be used for the electrodes of the Josephson junction, for example, films of niobium nitride (NbN) with a critical temperature of about 16 K, or magnesium diboride ($MgB_2$) with a critical temperature as high as 39 K.

Preferred magnetic materials may comprise both soft and hard magnetic materials. For example, one may use permalloy, a nickel-iron alloy with about 80% nickel. Other soft magnetic materials for cryogenic temperatures might include dilute alloys of Pd in Fe or copper-nickel alloys. The hard magnetic material may comprise pure nickel, or other materials known in the art.

The memory cell may be very compact, limited only by the size of the Josephson junction. Current Josephson junction fabrication technology enables junctions that are down to 200 nm in transverse dimensions. This is much smaller than prior art cryogenic memory technologies that comprise superconducting loops and multiple junctions, and have scales of several micrometers or more. Switching times for the write operation are limited by the switching time for the magnetic domain in the soft magnetic material, about 1 ns. Read times do not require switching magnetic domains, and can be of order 10 ps using low-power single-flux-quantum electronics.

Figure 4:
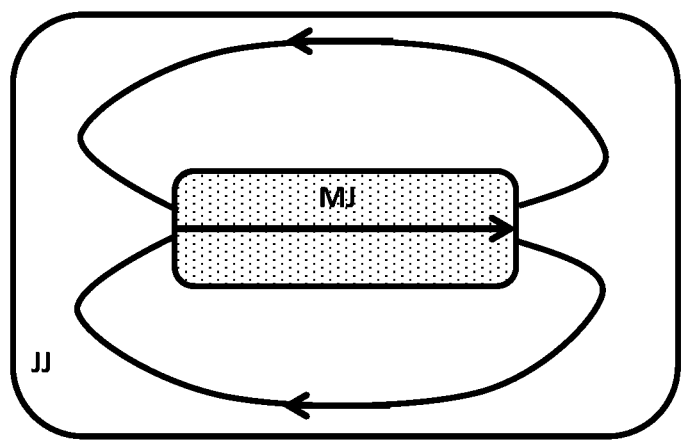
FIG. 4 shows a conceptual top view of one embodiment of a memory cell, with a smaller magnetic junction (MJ) sitting on top of a larger Josephson junction (JJ), with fringe fields coupled from the MJ to the JJ.

FIG. 4 is a conceptual drawing of one embodiment of a memory cell, showing a small magnetic junction (MJ) on top of a larger Josephson junction (JJ). This also shows the magnetic field lines emanating from the ends of the MJ for the case of parallel alignment of the magnetic films, corresponding to a logical '1'. This will also include perpendicular components of the field that penetrate at least part of the superconducting film of the JJ. The penetration of the field into the film, typically in the form of vortices, is responsible for a local suppression of critical current density in the JJ. For this reason, penetration of the fringe field should ideally cover a major fraction of the area of the JJ, so that the total effect of $I_c$ suppression will be significant. It is not necessarily required that the fringe fields are present on all sides of the MJ, but this configuration may be expected to provide the largest possible effect.

Figure 6:
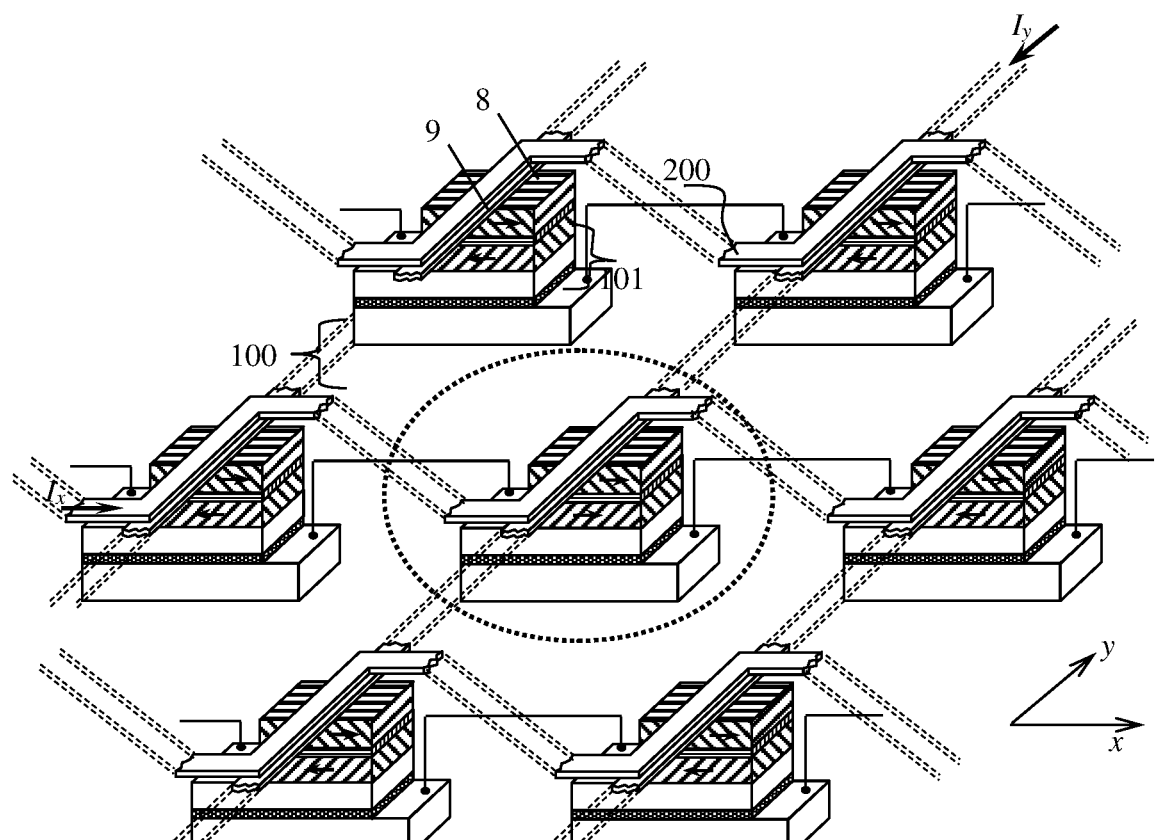
FIG. 6 shows a conceptual figure of a preferred embodiment of a two-dimensional array of hybrid superconductive-magnetic memory cells cell in accordance with the present invention.

FIG. 6 shows a conceptual picture of a two-dimensional array of hybrid magnetic-superconducting memory cells described above, which may be used to construct an addressible random-access memory (RAM) array for use with a superconducting computing or digital signal processing system. Such a memory array may have rows and columns, whereby a particular element in a given row and column may be selected by simultaneous inputs on a row and a column, where both inputs are required to trigger the write or read operation.

The memory density of an array can be greater than 1 $Mb/mm^2$.

The array is organized in such a way that a plurality of the Josephson junctions 100 are connected in series, using the wires 200, in the rows along the x axis. The corresponding plurality of the magnetic junctions 101 do not need to have electric contacts in this embodiment; however, such electric contact may be realized in other embodiments in accordance with the disclosed invention. Magnetization reversal of the "soft" magnetic layer (the bottom layer 4 in the magnetic junctions 101 in FIGS. 1 and 6) is accomplished by combined action of the magnetic field induced by the currents $I_x$ and $I_y$ supplied to the superconducting control lines running in perpendicular directions along the x and y axes. These control lines are insulated from the MJs and from each other by thin layers of dielectric material (e.g., $SiO_2$). The level of currents $I_x$, $I_y$ is such that all cells are half-selected by the fields created by each of these currents $I_x$, $I_y$ during the WRITE operation. However, for one selected cell (encircled with the thick dotted line in FIG. 6), the fields from the two lines add up (for the shown directions of the currents), thus enabling the magnetization reversal of the "soft" magnetic layer, so that, in this example, the magnetic moments of the magnetic layers in the magnetic junctions 101 become oriented in parallel.

Figure 7:
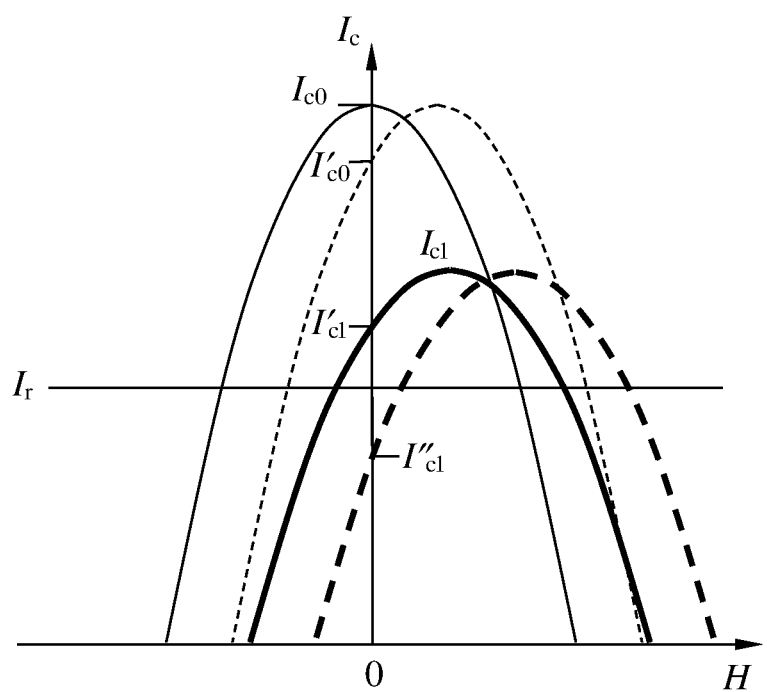
FIG. 7 shows plots of the critical current vs. applied magnetic field of the Josephson junction for different magnetization orientations in the magnetic layers of an adjacent magnetic junction.

The READ operation for the memory array is illustrated in FIG. 7, where the main lobes of the $I_c(H)$ dependences are shown for the anti-parallel (AP) and parallel (P) orientation of the magnetization vectors in the magnetic junction 101 (thin and thick solid curves, respectively). We assume that the cell is configured according to the embodiment shown in FIG. 3B, i.e., for the P magnetization orientations in the magnetic layers of the magnetic junction 101, the Josephson critical current of the Josephson junction 100 in the same cell is not only suppressed to $I_{c1}$ as compared with its magnitude $I_{c0}$ (which Josephson junction 100 has for the AP magnetizations orientations in the magnetic layers of the magnetic junction 101), but has actual value $I'_{c1}$ at H=0, because the respective $I_c(H)$ dependence is shifted along the H axis due to the influence of the magnetic field component parallel to the superconducting layers; the resultant modified $I_c(H)$ dependence as is shown by the thick solid line in FIG. 7.

During the READ operation, a current pulse with the amplitude of $I_r$ is supplied to the desired row of Josephson junctions; simultaneously, a current pulse with the amplitude of $I'_y$ is supplied to the respective column in order to select a Josephson junction whose state needs to be read out. The magnitude of $I'_y$ is such that it creates a magnetic field that shifts $I_c(H)$ along the H axis but cannot reverse the magnetization in any of the magnetic layers in the magnetic junction 101. The shifted $I_c(H)$ curves are shown as thin dashed line for the AP magnetization orientation in the half-selected cells and thick dashed line for the P magnetization orientation in the selected cell (encircled with the thick dotted line in FIG. 6). This shift is needed in order to move the steep slope of the main lobe of the $I_c(H)$ dependence close to H=0. The amplitude of the read current $I_r$ is chosen as shown by the horizontal line in FIG. 7. Without any current pulse $I'_y$, $I_r$ is lower than both $I'_{c0}$ and $I'_{c1}$ (values of the Josephson critical current in the Josephson junction 100 for the AP and P states in the magnetic junction 101 at H=0, respectively). However, if $I'_y$ is applied, it further shifts the $I_c(H)$ dependence along the H axis, so that the new $I''_{c1}$(H=0) value becomes lower than $I_r$ (but in all other cells which are half-selected, the $I'_{c0}$(H=0) value for the AP state is higher than $I_r$).

As a result of this READ procedure, the Josephson junction 100 in the selected cell undergoes transition into the resistive state if the magnetic junction 101 is in P state, but remains superconductive if the magnetic junction 101 is in AP state. The occurrence or absence of the switching event into the resistive state is registered as the presence or absence of a voltage pulse across the selected row, which determines the state of the selected cell.

Note that without the current $I'_y$ that selects the cell for readout operation along the y axis, the read current $I_r$ cannot switch the Josephson junction 100 into the resistive state even if its critical current is depressed by the P state of the magnetic junction 101. Therefore, all the cells with the depressed critical current (if any in the selected column), except for the selected cell, remain superconductive. Thus, the energy dissipation during the READ operation is minimal and is estimated to be ~1 fJ for an estimated read latency of 0.1 ns. The WRITE operation causes negligible energy dissipation within the array, because the control current flows through the superconducting lines.

Figure 8:
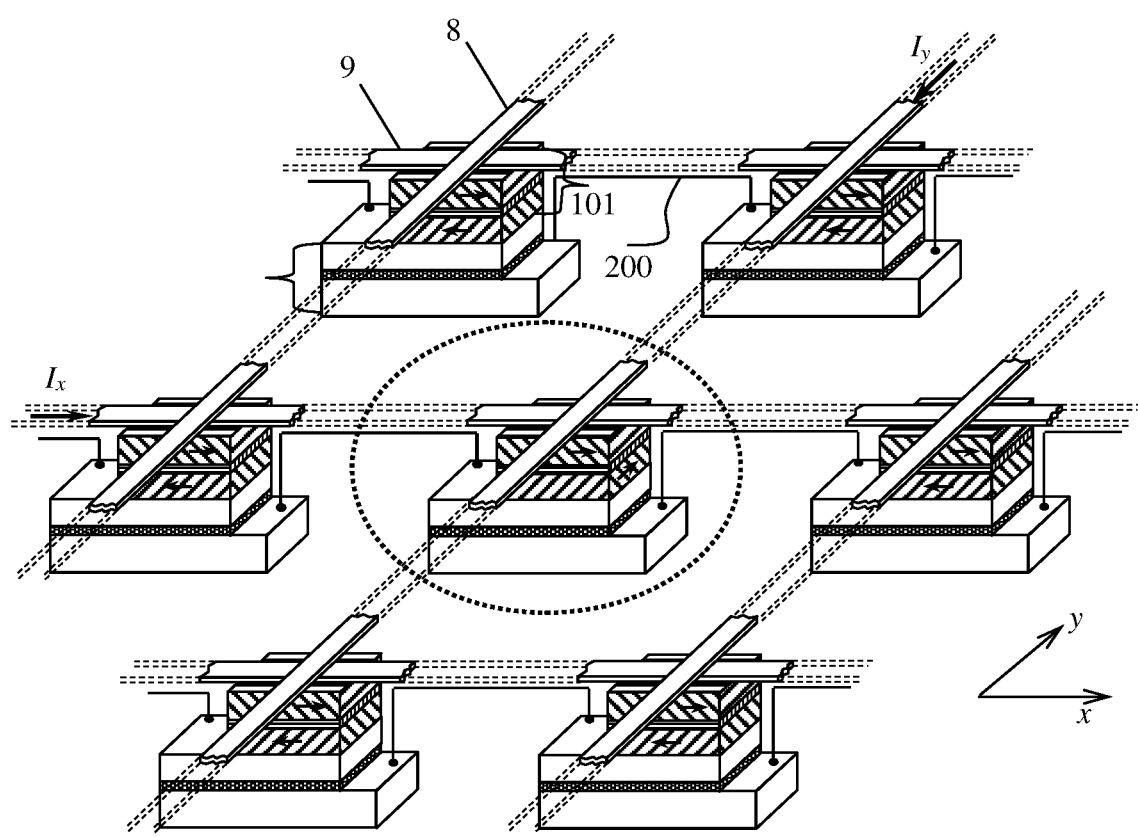
FIG. 8 shows a conceptual figure of the second preferred embodiment of a two-dimensional array of hybrid superconductive-magnetic memory cells cell in accordance with the present invention.

In another embodiment in accordance with the present invention, the memory cells and the control lines can be arranged in an array as shown in FIG. 8. The difference between the memory array presented in FIG. 6 and that presented in FIG. 8 is that, in the latter case, the control lines 8 and 9 produce magnetic fields in mutually perpendicular directions within the planes of the layers in the memory cell. In this case, according to theoretical calculations disclosed by Mironov et al., Appl. Phys. Lett. 113, 022601 (2018), and Devizorova et al., Phys. Rev. B 99, 104519 (2019), a larger shift of the $I_c(H)$ dependence along the H axis is expected for the Josephson junction 100 if the magnetization orientation of the magnetic layers 4 and 6 in the magnetic junction 101 (cf. FIG. 1) is changed from the AP to the mutually perpendicular direction. This is more favorable to realize the READ operation according to FIG. 7 as described above in accordance to the present invention, especially if the lateral dimensions of the said magnetic cell are reduced. The WRITE operation for the embodiment shown in FIG. 8 is accomplished in the same way as that for the embodiment shown in FIG. 6.

Figure 9:
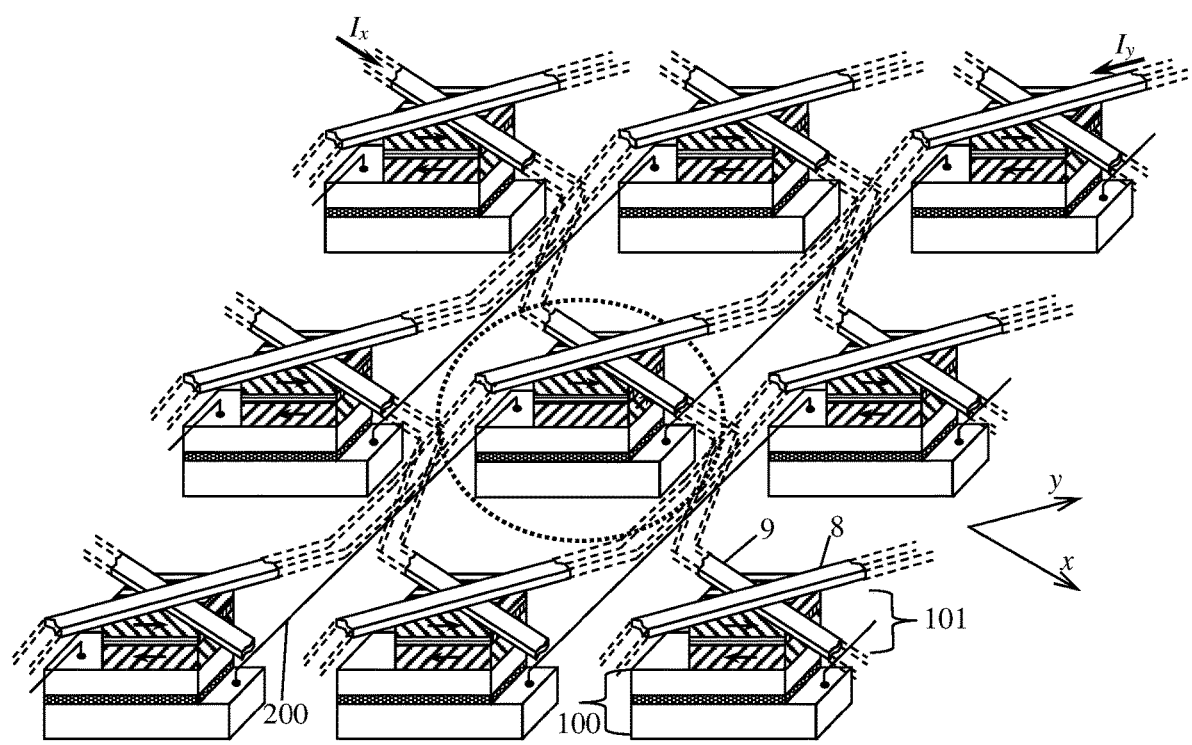
FIG. 9 shows a conceptual figure of the third preferred embodiment of a two-dimensional array of hybrid superconductive-magnetic memory cells in accordance with the present invention.

In yet another embodiment according to the present invention, the memory cells disclosed in this invention are arranged in an array shown in FIG. 9, wherein the control lines 8 and 9 run in parallel with the diagonals of the rectangles representing the in-plane area of the magnetic junction 101, and within the area of the magnetic junction 101. This allows for making use of the configurational anisotropy of the magnetic layers 4 and 6 in the magnetic junction 101. It is known for those skilled in the art that hysteretic properties, specifically, the value of the coercive force, of the magnetic elements depends on their shapes and the direction of the applied magnetic field. The embodiment shown in FIG. 9 allows for using lower switching fields of the "soft" magnetic layer in the magnetic junction 101, and therefore, allows for a broader choice of the materials used for magnetic layers 4 and 6 in the magnetic junction 101. In the particular embodiment shown in FIG. 9, the Josephson junctions 100 are connected along one of the diagonals using the wires 200; however, they can be connected in rows in a similar way shown for the array configurations in FIGS. 6 and 8. Both the WRITE and READ operations for the embodiment shown in FIG. 9 is accomplished in a similar way as that for the embodiment shown in FIG. 6, and takes place according to the description given above and is illustrated in FIG. 7.

Note that, in addition to the embodiments presented in FIGS. 6, 8, and 9, other configurations of arrays made of the memory cells disclosed in the present invention, are possible. Furthermore, the lateral shape of the Josephson junction 100 and that of the magnetic junction 101, according to the present invention, is not limited to the rectangular shape. It can be oval, or diamond-like, or other shape or a combination of different shapes for the Josephson junction 100 and the magnetic junction 101. Also, according to the present invention, the position of the magnetic junction 101 within the area of the Josephson junction 100 can be different. Moreover, according to the present invention, the magnetic junction 101 can be positioned not only on top, but also below the Josephson junction 100. Yet furthermore, according to the present invention, the control lines 8 and 9 can be positioned, separately or jointly, both below and above of the memory cell. Yet furthermore, the lateral shape of different magnetic layers 4 and 6 in the magnetic junction 101 can also be different, in accordance with the present invention.

We claim:

1. A memory cell, comprising:
   a magnetic junction comprising a pair of magnetic layers separated by a non-magnetic layer, the pair of magnetic layers having respectively distinct magnetization vectors and a resulting joint magnetization vector comprising the superposition of the distinct magnetization vectors; and
   a Josephson junction which is magnetically coupled to the magnetic junction, having a critical current which varies in response to the joint magnetization vector.

2. The memory cell according to claim 1, further comprising a planar substrate over which the pair of magnetic layers and non-magnetic layer are formed, wherein the Josephson junction comprises a pair of superconducting layers separated by an insulating layer, and at least one of the two superconducting layers has a portion which extends over at least one of the magnetic layers, wherein the critical current of the Josephson junction varies by at least 15% over a range of the joint magnetization vector of the magnetic junction.

3. The memory cell of claim 1, wherein the magnetic junction comprises a galvanic contact with the Josephson junction.

4. The memory cell of claim 1, wherein the magnetic junction and the Josephson junction are integrated on a common substrate as a set of layers, wherein at least one edge of the magnetic junction is superposed over a portion of the Josephson junction on the common substrate.

5. The memory cell of claim 1, wherein the non-magnetic layer comprises an electrically insulating barrier layer.

6. The memory cell of claim 1, wherein the non-magnetic layer comprises a non-magnetic metal layer.

7. The memory cell of claim 1, wherein the pair of magnetic layers have respective magnetization vectors switchable to achieve at least two switchable states, comprising a parallel state and an antiparallel state.

8. The memory cell of claim 1, wherein the pair of magnetic layers have respective magnetization vectors switchable to achieve at least two switchable states, comprising a perpendicular state and a non-perpendicular state.

9. The memory cell of claim 1, the joint magnetization vector of the magnetic junction is switchable by an electrical current in a wire.

10. The memory cell of claim 1, a magnetization vector of a magnetic layer has a threshold applied magnetic field for switching, and is switchable by a plurality of concurrent subthreshold applied magnetic fields supplied by control lines.

11. The memory cell of claim 10, wherein a first magnetic layer is configured as a soft magnetic layer and a second magnetic layer is configured as a hard magnetic layer, wherein the hard magnetic layer is configured to maintain a predetermined magnetization vector in presence of the threshold applied magnetic field for switching and the soft magnetic layer is configured to selectively align with the threshold applied magnetic field in the presence of the threshold applied magnetic field for switching.

12. The memory cell of claim 1, wherein the joint magnetization vector of the magnetic junction is switchable by injection of a spin-polarized current.

13. The memory cell of claim 1, further comprising an output port presenting a signal responsive to variations in the critical current of the Josephson junction.

14. The memory cell of claim 1, further comprising at least one first control line configured to set the magnetic junction into a first joint magnetization state, and at least one second control line configured to set the magnetic junction into a second joint magnetization state.

15. The memory cell of claim 1, wherein the pair of magnetic layers have shape anisotropy.

16. The memory cell of claim 1, wherein the pair of magnetic layers have different magnetic coercivity.

17. The memory cell of claim 1, wherein the Josephson junction comprises a layer of a superconducting material selected from the group consisting of niobium, niobium nitride, and magnesium diboride which is superconductive at a temperature below 5K.

18. The memory cell of claim 1, wherein at least one of the magnetic layers comprises a ferromagnetic material comprising at least one of Fe, Co, Ni, Al, Nb, Cu, Ag, and Pd.

19. The memory cell of claim 1, wherein at least one of the magnetic layers has a coercive field of about 1 Oe at 4K.

20. A method of operating a memory cell, comprising:
providing a memory cell comprising:
  a magnetic junction comprising a pair of isolated magnetic layers adapted to assume respectively distinct magnetization vectors; and
  a Josephson junction magnetically coupled to the magnetic junction, having a critical current responsive to a resulting joint magnetization vector comprising the superposition of the distinct magnetization vectors;
switching the magnetic junction to a first state in which the resulting joint magnetization vector is less than each of the respectively distinct magnetization vectors;
switching the magnetic junction to a second state in which the resulting joint magnetization vector is greater than each of the respectively distinct magnetization vectors; and
sensing a signal responsive to the variation in the critical current.

21. The method of claim 20, wherein the pair of magnetic layers have respective magnetization vectors switchable to achieve at least two switchable states, comprising at least one of:
a parallel state and an antiparallel state; and
a perpendicular state and a non-perpendicular state.

22. The method of claim 20, wherein the pair of isolated magnetic layers have a different response to an applied magnetic field, wherein:
a first magnetic layer remains in a predetermined magnetic field state, independent of a plurality of concurrent subthreshold magnetic fields manipulated by control signals; and
a second first magnetic layer responds to the plurality of concurrent subthreshold magnetic fields when aligned to form a joint suprathreshold magnetic field.

23. A memory array comprising:
a plurality of addressable memory cells, each memory cell comprising:
  a magnetic junction comprising a pair of isolated magnetic layers adapted to assume respectively distinct magnetization vectors; and
  a Josephson junction magnetically coupled to the magnetic junction, having a critical current responsive to a resulting joint magnetization vector comprising the superposition of the distinct magnetization vectors;
a set of control lines, configured to independently control the joint magnetization vector of each memory cell; and
a readout configured to produce a signal responsive to the critical current of a respective memory cell.

24. The memory array of claim 23, having a memory cell size of 200 nm and a memory cell density greater than 1 Mbit/mm$^2$.

25. The memory array of claim 23, having a switching time to change the joint magnetization vector of about 1 ns and a readout latency on the order 10 ps.

26. The memory array of claim 23, having an energy dissipation to produce the signal at the readout of ~1 fJ for an estimated read latency of 0.1 ns using low-power single-flux-quantum electronics.

27. The memory array of claim 23, wherein the set of control lines and the readout are configured to interface with a superconducting computing or superconducting digital signal processing system, and the plurality of addressable memory cells are configured to respond to at least row select and column select signals.

* * * * *